United States Patent
Anzaki et al.

(10) Patent No.: US 6,579,423 B2
(45) Date of Patent: Jun. 17, 2003

(54) LIGHT TRANSMITTING ELECTROMAGNETIC WAVE FILTER AND PROCESS FOR PRODUCING THE SAME

(75) Inventors: Toshiaki Anzaki, Osaka (JP); Etsuo Ogino, Osaka (JP)

(73) Assignee: Nippon Sheet Glass Co., Ltd., Osaka (JP)

( * ) Notice: Subject to any disclaimer, the term of this patent is extended or adjusted under 35 U.S.C. 154(b) by 0 days.

(21) Appl. No.: 10/011,765

(22) Filed: Dec. 11, 2001

(65) Prior Publication Data

US 2002/0086164 A1 Jul. 4, 2002

Related U.S. Application Data (62) Division of application No. 09/541,599, filed on Apr. 3, 2000, now abandoned.

(30) Foreign Application Priority Data

Apr. 6, 1999 (JP) .............................................. 11-98785

(51) Int. Cl.$^7$ .............................................. C23C 14/06
(52) U.S. Cl. ........................... 204/192.15; 204/192.12; 204/192.16; 204/192.22; 204/192.23; 204/298.12; 204/298.14; 204/298.26; 427/164; 427/165
(58) Field of Search ...................... 204/192.12, 192.15, 204/192.22, 298.06, 298.12, 298.14, 298.26, 192.16, 192.23; 427/164, 165; 428/673, 432, 446, 448, 469, 472, 697, 698, 699, 701, 702, 704

(56) References Cited

U.S. PATENT DOCUMENTS

| | | | |
|---|---|---|---|
| 5,071,206 A | 12/1991 | Hood et al. | 359/360 |
| 5,521,765 A * | 5/1996 | Wolfe | 359/359 |
| 5,611,899 A * | 3/1997 | Maass | 204/298.08 |
| 5,928,572 A | 7/1999 | Tonar et al. | 252/583 |
| 6,104,530 A * | 8/2000 | Okamura et al. | 359/359 |
| 6,104,534 A | 8/2000 | Ohta et al. | 359/588 |
| 6,252,703 B1 | 6/2001 | Nakamura et al. | 359/360 |
| 6,277,507 B1 | 8/2001 | Anzaki et al. | 428/702 |
| 6,306,525 B1 * | 10/2001 | Schicht et al. | 359/359 |
| 6,316,110 B1 | 11/2001 | Anzaki et al. | 428/432 |
| 6,420,007 B2 * | 7/2002 | Usami | 204/192.12 |

FOREIGN PATENT DOCUMENTS

| | | |
|---|---|---|
| EP | 0 751 099 A1 | 1/1997 |
| EP | 0 852 266 A1 | 7/1998 |
| EP | WO 99/05546 | 2/1999 |

OTHER PUBLICATIONS

European Patent Office Patent Abstract of Japan, vol. 1996, No. 8 (1996) (JP 08 104547) (Apr. 23).
European Patent Office Patent Abstract of Japan, vol. 18, No. 517 (1994) (JP 06 172994) (Jun. 21).
European Search Report (No date).

* cited by examiner

*Primary Examiner*—Deborah Jones
*Assistant Examiner*—Andrew Piziali
(74) *Attorney, Agent, or Firm*—Sughrue Mion, PLLC

(57) ABSTRACT

A light transmitting electromagnetic wave filter comprising a transparent and a light transmitting electromagnetic wave shield film having a laminate structure composed of 2n+1 (n≧1) layers in which at least two dielectric layers and at least one silver layer are alternately laminated, with each other with the dielectric layer being the first to be provided on the transparent substrate, wherein at least one of the dielectric layers is an antistatic metal oxide layer having a refractive index of 1.6 to 2.7 at a wavelength of 550 nm, which is preferably formed by sputtering using a metal oxide, e.g., tin-containing indium oxide, as a target in an atmosphere having a reduced oxygen content. The electromagnetic wave filter has a high visible light transmission and a low near infrared transmission, is free from pin holes or contamination, and exhibits high durability against moist heat, etc.

4 Claims, 4 Drawing Sheets

FIG. 5

LIGHT TRANSMITTING ELECTROMAGNETIC WAVE FILTER AND PROCESS FOR PRODUCING THE SAME

This is a divisional of application Ser. No. 09/541,599 filed Apr. 3, 2000 now abandoned, the disclosure of which is incorporated herein by reference.

FIELD OF THE INVENTION

This invention relates to an electromagnetic wave filter which is to be set in front of a cathode ray tube (CRT) or a display, such as a field emission display (FED) or a plasma display panel, to cut the electromagnetic waves emitted from the display, etc. and a process for producing the same.

Because the electromagnetic wave filter of the invention is transparent to light and electrically conductive, it is also useful as a transparent conductive film. Further, it exhibits electromagnetic wave shielding performance over a broad range of wavelengths including the near infrared region and even longer wavelengths and is therefore applicable as heat-shielding window glass of buildings or automobiles.

BACKGROUND OF THE INVENTION

Conventional transparent electromagnetic wave filters comprising a transparent substrate, such as a glass plate, coated with an electromagnetic wave shield film include those comprising a transparent substrate having alternately formed thereon dielectric layers, such as transparent metal oxide layers, and a silver layer(s).

JP-A-5-42624 discloses a glass plate coated with an electromagnetic wave shield film having a silver layer sandwiched in between a pair of laminates of dielectric layers, showing in Example 2 an electromagnetic wave shield film having a laminate structure of (substrate)/ZnO/$SnO_2$/ZnO/$SnO_2$/ZnO/Ag/ZnO/$SnO_2$/ZnO/$SnO_2$/ZnO (n=1). In this Example the metal oxide layers ZnO and $SnO_2$ are formed by oxygen-reactive sputtering using ZnO and $SnO_2$ as respective targets and a reactive gas comprising argon and oxygen.

JP-A-9-85893 proposes a glass plate coated with an infrared ray shield film having a laminate structure in which a dielectric layer and a silver layer are alternately laminated with each other. For example, Example 11 shows an infrared ray shield film having a 5-layered laminate structure of (glass)/Al-containing ZnO/Pd-containing Ag/Al-containing ZnO/Pd-containing Ag/Al-containing ZnO (two silver layers are used; n=2), and Example 13 describes a laminate structure in which the outermost dielectric layer is a laminate of an Al-containing ZnO layer and an Si-containing $SnO_2$ layer. Each of these dielectric layers is formed by oxygen-reactive sputtering using the respective metal constituting the metal oxide layer as a target and oxygen or an oxygen/argon mixed gas as shown in Table 1.

JP-A-8-104547 teaches heat-insulating glass comprising a glass plate having formed thereon an infrared ray shield film. The infrared ray shield film is a laminate of a silver layer and a metal oxide layer as exemplified in Tables 1 and 6. For example, Example 13 demonstrates a 5-layered laminate structure of (glass)/ZnO:$Al_2O_3$/Ag/ZnO:$Al_2O_3$/Ag/ZnO:$Al_2O_3$ (two silver layers are used; n=2). The ZnO:$Al_2O_3$ layer is formed by sputtering using a sintered body comprising ZnO containing 2% by weight of $Al_2O_3$ as a target.

Highly bright image display of a plasma display panel can be achieved by a powerful plasma discharge in a discharge cell. Therefore, the plasma display panel emits near infrared rays as well as electromagnetic waves from the discharge cell toward the front of the panel. It has been pointed out that electromagnetic waves have a possibility of giving adverse influences to a human body. Further, the infrared rays emitted may be detected by the receptor of a remote control of an appliance near the plasma display, tending to cause an incorrect action of turning the switch on.

To overcome the above problems, it has been suggested to provide a transparent material having electromagnetic wave shielding performance in front of the plasma display panel. For this purpose, it has been a practice that an electromagnetic wave filter comprising a glass plate having on one side thereof an alternate laminate of dielectric layers and a silver layer(s) is attached to the front of a plasma display. Such an electromagnetic wave filter is required to satisfy the following performance requirements.

(1) A shielding effect against electromagnetic waves (i.e., low sheet resistance of the electromagnetic wave shielding film);

(2) a low transmission for heat rays of the near infrared region (region of from 800 to 900 nm), which are used for remote control of appliances;

(3) a high visible light transmission to secure a bright image display;

(4) sufficient durability against moist heat, etc. for use as exposed in air; and (5) freedom from pin holes or contamination with foreign matter.

Aiming at settlement of all the outstanding problems, the concept of the present invention lies in that the requirements (1) through (4) are satisfied by designing the laminate structure of dielectric layers and a silver layer(s) to have the characteristics of a so-called optical low path filter, i.e., to have a high visible light transmission and a low near infrared transmission, showing a sharp change in transmission at the border of the two regions. The concept also resides in that the requirement (5) is met by designing a novel layer as the dielectric layers of the laminate.

As mentioned above, the electromagnetic wave shield film disclosed in JP-A-5-42624 supra has one silver layer sandwiched between laminates of dielectric layers. The silver layer, which secures electromagnetic wave shielding performance, should have an increased thickness to exhibit satisfactory performance, but such results in a visible light transmission loss. Therefore, the requirements (1), (2) and (3) are not to be satisfied simultaneously. Moreover, because the ZnO layer and $SnO_2$ layer constituting the dielectric layers are electrically insulating, it has been difficult to obtain glow discharge plasma in a stable manner in forming these layers by sputtering, only to provide a film suffering from pinholes or adhesion of foreign matter.

The laminate disclosed in JP-A-9-85893 supra, which comprises Al-containing ZnO layers and Pd-containing Ag layers, accomplishes improvements on the requirements (1) and (3) owing to the two silver layers but still fails to fulfil the requirement (2), i.e., an erroneous action preventive function. That is, the laminate has insufficient performance to be used as an electromagnetic wave filter in front of a plasma display panel. Additionally, because the dielectric layer comprising a metal oxide is formed by oxygen-reactive sputtering by using the corresponding metal as a target and oxygen gas or a mixed gas of oxygen and argon gas, the electrically insulating metal oxide is deposited on the substrate and near the surface of the target. It tends to follow that charges stay on the surface of the target and of the substrate to cause sparks or arcs, failing to obtain a stable glow discharge in the thin film formation. As a result, the metal oxide layer can suffer from pin holes due to microsparks or adhesion of foreign matter during the film formation.

The infrared ray shield film of JP-A-8-104547 supra, which also contains two silver layers, meets difficulty in satisfying the requirements for high electromagnetic wave shielding performance, low near infrared ray transmission, and high visible light transmission for the same reasons as mentioned above. The dielectric layers of the laminate are layers mainly comprising zinc oxide which are formed by oxygen-reactive sputtering using a mixture of $Al_2O_3$ and 2% by weight of ZnO as a target. However, the dielectric layers formed on the substrate have high electric resistance so that the surface undergoes electrification during film formation, which can result in pin holes.

SUMMARY OF THE INVENTION

An object of the present invention is to solve the above-described problems associated with conventional techniques and to provide an electromagnetic wave filter having performance properties required of a practical and high-performance filter.

The object is accomplished by a light transmitting electromagnetic wave filter comprising a transparent substrate having on one side thereof a light transmitting electromagnetic wave shield film comprising a laminate of 2n+1 ($n \geq 1$) layers in which at least two dielectric layers and at least one silver layer are alternately laminated with each other with the dielectric layer being the first to be provided on the transparent substrate, wherein at least one of the dielectric layers is an antistatic metal oxide layer having a refractive index of 1.6 to 2.7 at a wavelength of 550 nm.

The dielectric layer of the laminate has antistatic properties, while the silver layer is conductive. Therefore, charges are prevented from staying on the electromagnetic wave shield film while the film is formed on the substrate. Thus, abnormal discharges can be suppressed while laminating a silver layer with a dielectric layer by sputtering, and there is obtained a laminate hardly suffering from pin holes resulting from an abnormal discharge or contamination with foreign matter.

The metal oxide layer constituting the dielectric layer has a refractive index of 1.6 to 2.7 at 550 nm. If the refractive index is smaller than 1.6, the effect of light interference in improving transparency to visible light will be lessened, making it difficult to obtain an increased visible light transmission. For ensuring the improvement in visible light transmission, a preferred refractive index of the metal oxide layer is 1.9 or higher. The upper limit of the refractive index of the metal oxide la at 550 nm is 2.7 times that of titanium dioxide, which has the highest refractive index among metal oxides.

DETAILED DESCRIPTION OF THE INVENTION

The transparent substance which can be used in the present invention includes known glass plates, such as soda-lime glass, borosilicate glass, and alkali-free glass; and plastic plates or films, such as polypropylene (PP), polyester (PE), polyethylene terephthalate (PET), polymethyl methacrylate (PMMA), triacetyl cellulose (TAC), and polycarbonate (PC). The substrate does not need to have perfect flatness. It may have a curved surface or a variable shape.

It is preferred that the antistatic metal oxide layer has a specific resistance (volume resistivity) of 5 Ωcm or less. The thickness of the metal oxide layer is adjusted so as to increase the transmission in the visible wavelength region. With the specific resistance controlled to 5 Ωcm or less, plasma arcing (an abnormal discharge) can be prevented during film formation by sputtering under reduced pressure to thereby suppress development of pin holes effectively.

In a preferred embodiment, the antistatic metal oxide layer comprises indium oxide as a main component, the indium oxide containing tin (hereinafter referred to as an ITO layer). The tin content in indium oxide is preferably 0.1 to 10% by weight in terms of tin oxide.

In another preferred embodiment, the antistatic metal oxide layer comprises tin oxide as a main component, the tin oxide containing at least one metal selected from the group consisting of antimony, bismuth, zinc, and indium. The content of the metal in tin oxide is preferably 0.1 to 10% by weight in terms of its oxide. Presence of such a metal oxide makes a tin oxide layer electrically conductive and antistatic. With the metal oxide content being less than 0.1% by weight, the tin oxide layer would be substantially electrically insulating, exhibiting no antistatic properties. A preferred content of the metal oxide is 4% by weight or more.

In another preferred embodiment, the antistatic metal oxide layer comprises zinc oxide as a main component, the zinc oxide containing at least one metal selected from the group consisting of aluminum, gallium, and indium. Zinc oxide is endowed with the character of a semiconductor by doping with aluminum, gallium or indium and thereby maintains antistatic properties. The content of these metals in zinc oxide is preferably 0.1 by weight or more, still preferably 4% by weight or more, in terms of their oxide. With the metal oxide content being less than 0.1% by weight, the zinc oxide layer would be electrically insulating, having no effective antistatic properties. Incorporation of more than 10% by weight of the metal oxide into zinc oxide does not lead to further appreciable improvement in antistatic properties.

In another preferred embodiment, the antistatic metal oxide layer comprises zirconium oxide as a main component, the zirconium oxide containing at least one metal selected from the group consisting of vanadium, niobium, and tantalum. Zirconium oxide is endowed with the character of a semiconductor by doping with vanadium, niobium or tantalum and can exhibit antistatic properties. The content of these metals in zirconium oxide is preferably 0.1 to 10% by weight in terms of their oxide. With the metal oxide content being less than 0.1% by weight, the zirconium oxide layer would be electrically insulating, having no antistatic properties.

In still another preferred embodiment, the antistatic metal oxide layer comprises cerium oxide as a main component, the cerium oxide containing praseodymium. The praseodymium content in the cerium oxide is preferably 0.1 to 10% by weight in terms of praseodymium oxide for the same reasons described above.

In yet another preferred embodiment, the antistatic metal oxide layer comprises niobium oxide as a main component, the niobium oxide containing molybdenum. The molybdenum content in the niobium oxide is preferably 0.1 to 10% by weight in terms of molybdenum oxide based on the weight of niobium oxide.

In additional another preferred embodiment, the antistatic metal oxide layer comprises titanium oxide as a main component, the titanium oxide containing at least one of vanadium and niobium. The vanadium and/or niobium content in titanium oxide is preferably 0.1 to 10% by weight in terms of an oxide for the same reasons described above.

It is also a preferred embodiment that at least the outermost one of the dielectric layers is a laminate comprising the aforementioned antistatic metal oxide layer and a barrier layer selected from silicon nitride, silicon oxynitride, and tin oxide. In this embodiment, a part, in the thickness direction, of the antistatic metal oxide layer is displaced with any of silicon nitride, silicon oxynitride and tin oxide to make a laminate structure of the metal oxide layer and a barrier layer, which brings about improvement on moist heat resistance of the electromagnetic wave shield film as a whole. A preferred oxygen content of the silicon oxynitride layer, in terms of the atomic ratio O/(O+N), is 0.5 or smaller. With the oxygen atomic ratio being 0.5 or smaller, the microscopic lattice structure of the layer is relaxed to decrease the internal stress of the layer. As a result, corrosive impurities originated in the air or a pressure-sensitive adhesive (hereinafter described) are effectively prevented from penetrating, and delamination of the laminate can be prevented.

The thickness of the barrier layer is relatively small, being a half or less of the dielectric layer. Being so thin, the barrier layer, while electrically insulating, does not allow many charges to stay there during film formation, thereby avoiding pin hole development.

Where a dielectric layer is a laminate of the antistatic metal oxide layer and the barrier layer, it is preferred that the metal oxide layer be interposed between the barrier layer and an underlying silver layer so as to avoid direct contact between the barrier layer and the silver layer. In this manner the adverse influences of nitrogen plasma or oxygen plasma generated in the formation of the barrier layer onto the silver layer can be excluded, and corrosive impurities originated in the air or a pressure-sensitive adhesive (used for adhesion of a resin film) and the like are effectively prevented from entering the silver layer.

The silver layer preferably contains 0.1 to 3% by weight of palladium and 0.1 to 3% by weight, in total, of titanium and/or copper. Incorporation of palladium as a first dopant and titanium and/or copper as a second dopant into silver brings about further improvement on resistance of the silver layer against moist heat.

The light transmitting electromagnetic wave filter of the invention preferably has a luminous transmittance of 60% or more and a transmission of 20% or less at a wavelength of 850 nm. The electromagnetic wave filter having such transmission characteristics preferably includes the one whose light transmitting electromagnetic wave shielding film has a 7-layered laminate (n=3) in which the dielectric layer closest to the transparent substrate has a thickness of 28 to 52 nm, the four dielectric layers have a thickness ratio of 36±4:71±7:70±7:32±3 in the order from the layer closest to the substrate, the silver layer closest to the transparent substrate has a thickness of 7 to 18 nm, and the three silver layers have a thickness ratio of 10±1:12±1:10±1 in the order from the layer closest to the substrate.

Where the thicknesses of the dielectric layers fall within the above ranges; it is possible to increase the transmission and to reduce the reflectance in the visible region while making the color of the reflected light neutral to pale purple and the color of the transmitted light neutral. Where the thicknesses of the silver layers fall within the above-specified ranges, the electromagnetic wave shielding properties and the near infrared ray shielding properties can be improved to the levels demanded for use as a front filter of a plasma display. It is preferred for the laminate to have 7 or more layers (n≧3) for securing the performance. The number n is preferably equal to or less than 5 from the economical considerations.

The transmission at 850 nm can be reduced to 20% or less by dividing a silver layer into three portions partitioned by the dielectric layers and by appropriately selecting the thickness of each silver layer. The luminous transmittance can be increased to 60% or more by proper selection of the thickness of each dielectric layer. With a luminous transmittance of 60% or higher, a bright image display can be obtained from a plasma display, and leakage of near infrared rays from the plasma display panel can be inhibited effectively. Further, with the dielectric layer thickness property adjusted, the reflected light when seen in the direction perpendicularly to the transparent substrate will have such a color as represented by $-1≦a^*≦10$, $-10≦b^*≦0$, and $|a^*|<1.5×|b^*|$ in accordance with the Cealab color coordinate system. The color within the above-specified region is favorable in practical use, giving no adverse influence on the color display characteristics.

The present invention includes an embodiment in which a resin film is adhered to the surface of the light transmitting electromagnetic wave shield film with a pressure-sensitive adhesive. The resin film is provided for chemically protecting the electromagnetic wave shield film from the air and preventing the glass from shattering when broken. The resin film preferably has a refractive index of 1.40 to 1.70 at 550 nm so as not to reduce the luminous transmittance. A refractive index of the resin film exceeding 1.70 makes a large difference from that of the electromagnetic wave shield film to increase the interfacial reflected light, resulting in a reduction in transmission of the electromagnetic wave filter. If the refractive index of the resin film is smaller than 1.40, the color of the reflected light seen by a user will be appreciably deviated from a neutral color, which is unfavorable for appearance.

A preferred thickness of the resin film is 1 μm to 5 mm. Resins which can be used for the resin film include polypropylene (PP), polyester (PE), polyethylene terephthalate (PET), triacetyl cellulose (TAC), and polyurethane (PW).

The resin film can be adhered to the electromagnetic wave shield film either by applying an adhesive or a pressure-sensitive adhesive layer. The pressure-sensitive adhesive layer preferably includes an acrylic resin pressure-sensitive adhesive layer for its satisfactory durability. The pressure-sensitive adhesive layer preferably has a thickness of 20 to 500 μm. A thinner adhesive layer than 20 μm is insufficient for leveling its surface when foreign matter enters, which can result in product defects perceptible with the naked eye. A thicker adhesive layer than 500 μm tends to have difficulty in preventing moisture incorporation, resulting in impairment of the durability, such as moist heat resistance, of the electromagnetic wave shield film.

If desired, an antireflection (or low-reflection) coating or a reflection diffusion treatment (non-glare treatment) may be applied to the resin film. It is preferred for the adhesive to be filtered beforehand to remove any solid matter, which may scratch the light transmitting electromagnetic wave shield film when the resin film is stuck.

The present invention further provides a preferred process for producing the above-described light transmitting electromagnetic wave filter according to the present invention. That is, the invention provides a process for producing a light transmitting electromagnetic wave filter comprising a transparent substrate having on one side thereof a light transmitting electromagnetic wave shield film comprising 2n+1 (n≧1) layers in which at least two dielectric layers and at least one silver layer are alternately laminated with each other with the dielectric layer being the first to be provided on the transparent substrate, wherein said silver layer is formed by sputtering using silver as a target, and said dielectric layers are each formed by sputtering using, as a target, a metal oxide whose sheet resistance is 50 Ω/□ or less.

In a highly preferred embodiment of the process, the sputtering for forming the dielectric layers is carried out in such a manner that a sintered body of a metal oxide powder is set on a pair of adjacent magnetron cathodes, and a negative voltage is applied to each cathode while alternately reversing the polarity between them at a frequency of 10 Hz to 1 MHz to generate glow discharge plasma thereby to sputter the target.

Figure 1A:
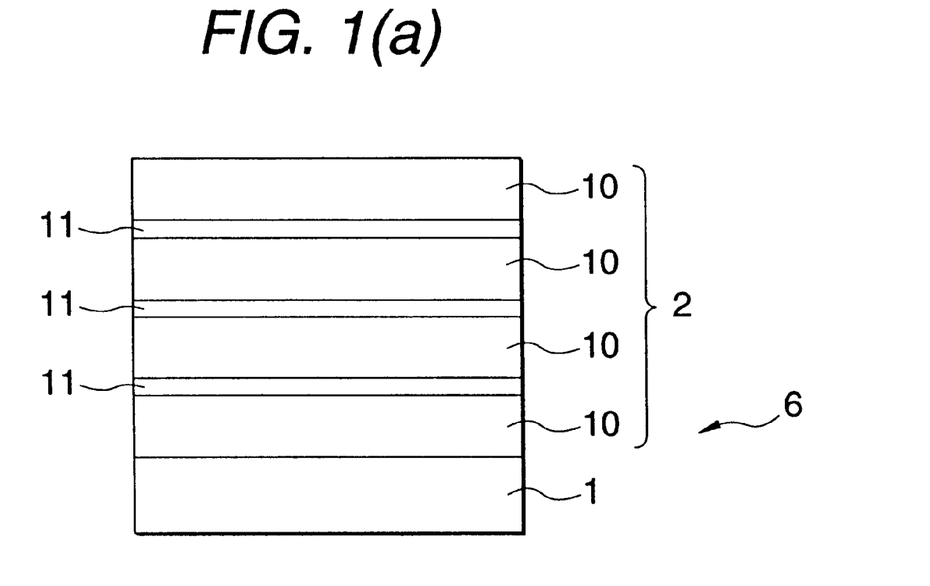
FIGS. 1(a) and 1(b) are a cross section of light transmitting electromagnetic wave filters according to the present invention.

FIG. 1A shows an embodiment of the light transmitting electromagnetic wave filter according to the invention. The light transmitting electromagnetic wave filter 6 has a transparent substrate 1 and a light transmitting electromagnetic wave shield film 2 formed on one side of the substrate 6. The light transmitting electromagnetic wave shield film 2 comprises alternating dielectric layers 10 and silver layers 11.

The metal oxide layer constituting the dielectric layer should contain an antistatic metal oxide having a refractive index of 1.6 to 2.7 at a wavelength of 550 nm. The main component making up the metal oxide layer includes indium oxide, tin oxide, zinc oxide, zirconium oxide, cerium oxide, niobium oxide, and titanium oxide. The character of a semiconductor can be imparted to these metal oxides as a main component by doping with a small amount of other metal oxides. In order to secure preferred antistatic properties, the specific resistance of the metal oxide layer is preferably 5 Ωcm or less, still preferably 0.5 Ωcm, particularly preferably 0.05 Ωcm or less.

Since the metal oxide layer constituting the dielectric layer exhibits antistatic properties, it is prevented from being charged while formed by sputtering. As a result, micro arcing can be prevented, and a layer free from pin holes or contamination with foreign matter can be obtained.

Of the above-described metal oxides as a main component, only indium oxide is capable of becoming an electrically conductive and thereby antistatic layer by itself. Addition of tin increases the antistatic properties. Layers made of the metal oxides other than indium oxide are substantially insulating when used alone. Addition of a small amount of other metals to the metal oxides provides transparent metal oxide layers which have antistatic properties based on the nature of an n- or p-type semiconductor.

The antistatic metal oxide layer has a refractive index of 1.6 to 2.7.

The antistatic metal oxide layer can be of (a) indium oxide or tin-containing indium oxide (ITO), (b) tin oxide containing a small amount of at least one metal selected from the group consisting of antimony, bismuth, zinc, and indium, (c) zinc oxide containing a small amount of at least one metal selected from the group consisting of aluminum, gallium, and indium, (d) zirconium oxide containing a small amount of at least one metal selected from the group consisting of vanadium, niobium, and tantalum, (e) cerium oxide containing a small amount of praseodymium, (f) niobium oxide containing a small amount of molybdenum, or (g) titanium oxide containing a small amount of least one metal selected from the group consisting of vanadium and niobium.

The conductive metal oxide layer is preferably provided by low-pressure sputtering using a green body or a sintered body of that metal oxide as a target. The metal oxide target should have a sheet resistance of 50 Ω/□ or less, preferably 5 Ω/□ or less, still preferably 0.5 Ω/□ or less. The sheet resistance of the metal oxide target can be so controlled by properly selecting the composition and the particle size of the powder, sintering conditions, and the like. With the controlled sheet resistance, a glow discharge can be generated easily and stably by a direct current power source or an alternating current power source.

In the present invention, it is preferable that all the metal oxide layers are electrically conductive, but it is sufficient if at least one of the metal oxide layer is conductive.

Sputtering methods for forming metal oxide layers which can be used in the invention for preference are described below.

1) ITO Layer

A sintered body comprising a mixture of indium oxide and up to 10% by weight, in terms of an oxide, of tin is used as a target. Sputtering is carried out in an argon atmosphere containing a small amount of oxygen.

2) Aluminum-Containing Zinc Oxide Layer (Hereinafter Referred to as an AZO Layer)

A sintered body comprising a mixture of zinc oxide and 4 to 10% by weight, in terms of aluminum oxide, of aluminum is used as a target. Sputtering is conducted in an argon atmosphere containing a small amount of oxygen.

3) Antimony-Containing Tin Oxide Layer

A sintered body comprising a mixture of tin oxide and 0.1 to 10% by weight, in terms of an oxide, of antimony is used as a target. Sputtering is carried out in an argon atmosphere containing a small amount of oxygen.

4) Cerium-Containing Indium Oxide Layer (Hereinafter Referred to as an ICO Layer)

A sintered body comprising a mixture of indium oxide and up to 20% by weight, in terms of an oxide, of cerium is used as a target. Sputtering is carried out in an argon atmosphere containing a small amount of oxygen.

5) Zinc-Containing Indium Oxide Layer (Hereinafter Referred to as an IZO Layer)

A sintered body comprising a mixture of indium oxide and 0.1 to 10% by weight, in terms of an oxide, of zinc is used as a target. Sputtering is carried out in an argon atmosphere containing oxygen.

6) Zinc-Containing Tin Oxide Layer

A sintered body comprising a mixture of tin oxide and 0.1 to 10% by weight, in terms of an oxide, of zinc is used as a target.

7) Vanadium- or Niobium-Containing Zirconium Oxide Layer

A sintered body comprising a mixture of zirconium oxide and 0.1 to 10% by weight, in terms of an oxide, of vanadium or niobium is used as a target. Sputtering is carried out in an argon atmosphere containing a small amount of oxygen.

8) Molybdenum-Containing Niobium Oxide Layer

A sintered body comprising a mixture of niobium oxide and 0.1 to 10% by weight, in terms of an oxide, of molybdenum is used as a target. Sputtering is carried out in an argon atmosphere containing a small amount of oxygen.

9) Vanadium- or Niobium-Containing Titanium Oxide Layer

A sintered body comprising a mixture of titanium oxide and 0.1 to 10% by weight, in terms of an oxide, of vanadium or niobium is used as a target. Sputtering is carried out in an argon atmosphere containing a small amount of oxygen.

The silver layer may by doped with a small amount of other metallic element to have improved moist heat resistance. Dopant metals include palladium, platinum, gold, copper, and titanium. In particular, palladium is preferred; for it brings about improvement on moist heat resistance of the silver layer without being accompanied by a considerable transmission loss of the layer. A preferred palladium content is 0.1% by weight or more, particularly 0.5% by weight or more, based on silver. Incorporation of too much palladium, on the other hand, results in appreciable reduction of the near infrared ray shielding performance, i.e., the transmission in the near infrared region of 800 to 900 nm increases. Therefore, the palladium content is preferably up to 3.0% by weight, particularly 1.0% by weight or less. In addition to palladium, it is preferred to add titanium and/or copper as a second dopant to improve durability of silver against sulfur components or chloride components which may enter from the outer environment. To avoid considerable reductions in optical and electrical characteristics, titanium and/or copper is (are) preferably added in a total amount of 0.1 to 3% by weight.

For the purpose of improving the durability of the light transmitting electromagnetic wave shield film, a barrier layer can be provided. The barrier layer affords more effective protection for the silver layer against corrosive impurities, such as moisture, chloride components, and sulfur components, which may enter from the surface of the shield film. It is preferred for the barrier layer not to be located in contact with the underlying silver layer so that the nitrogen plasma or oxygen plasma used in forming the barrier layer by sputtering may not adversely affect the silver layer. That is, the barrier layer is preferably provided on the outer side of the metal oxide layer constituting the outermost dielectric layer or as an intermediate layer of a metal oxide layer.

Figure 1B:
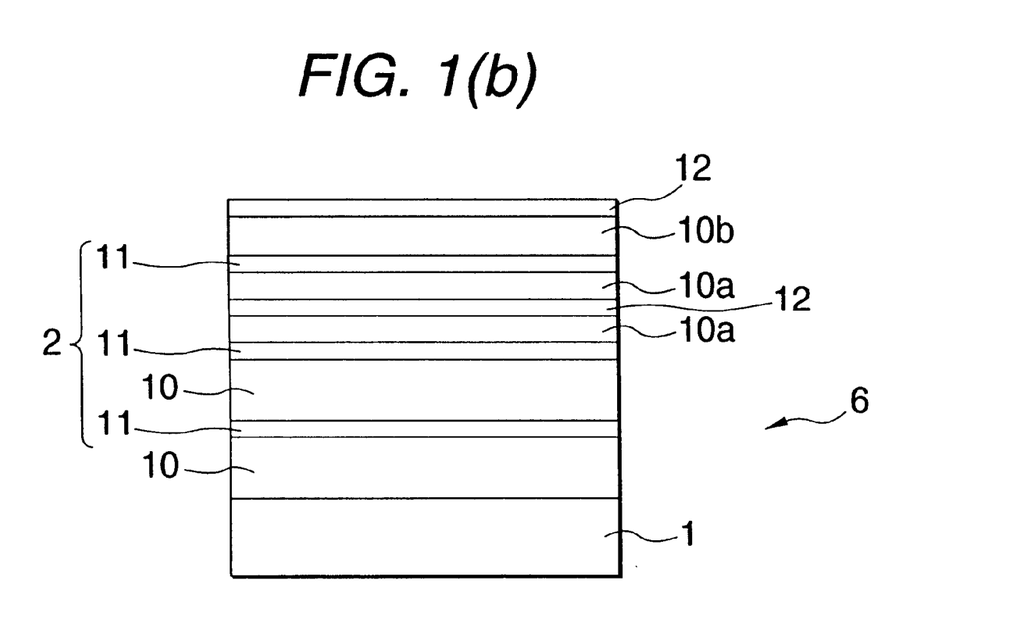

FIG. 1B shows an embodiment in which barrier layers are provided. The filter 6 shown has a transparent substrate 1 having thereon a light transmitting electromagnetic wave shield film 2 having alternating dielectric layers 10 and silver layers 11. A barrier layer 12 cuts into the third dielectric layer 10 as counted from the substrate to divide the dielectric layer 10 into two metal oxide layers 10a. Further, the outermost dielectric layer 10 has a laminate structure composed of a metal oxide layer 10b and a barrier layer 12. It is a suitable manipulation for raising the visible light transmission that the thickness of the silver layer closest to the transparent substrate 1 is relatively thin, ranging from 7 to 13 nm. On the other hand, it is suitable for lowering the transmission at around 850 nm that the thickness of that silver layer is relatively thick, ranging from 10 to 18 nm. For example, a light transmitting electromagnetic wave filter having the structure of FIG. 1B in which the silver layer 11 closes to the transparent substrate 1 has a thickness of 12 nm and the dielectric layer 11 provided directly on the substrate 1 has a thickness of about 40 nm has a sheet resistance of about 2 Ω/□, a luminous transmittance of 60% or more, and a transmission of 20% or less at a wavelength of 850 nm.

Figure 2:
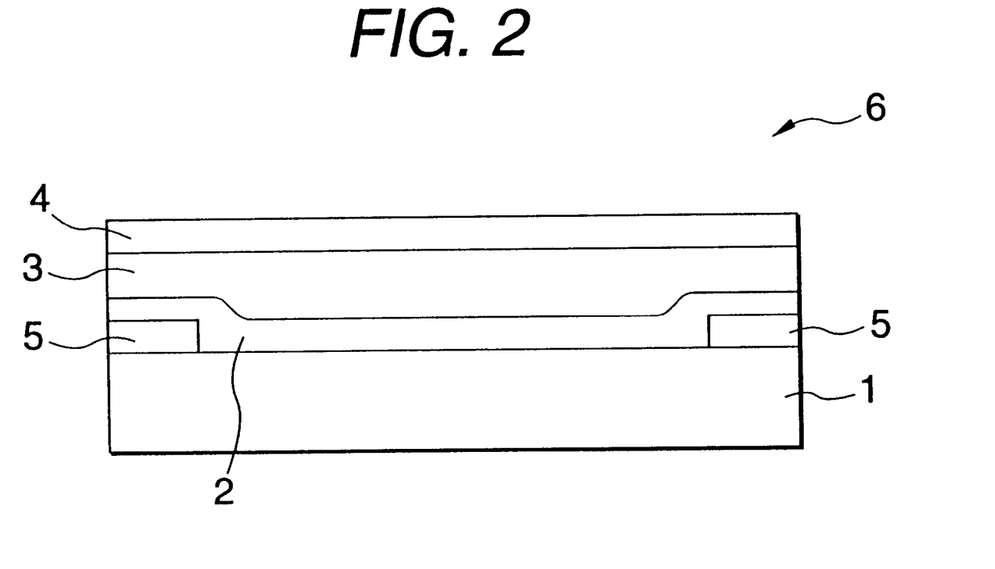
FIG. 2 is a cross section of another light transmitting electromagnetic wave filter according to the invention.

FIG. 2 shows another embodiment of the electromagnetic wave filter according to the present invention. The electromagnetic wave filter 6 has a transparent substrate 1, an electromagnetic wave shield film 2, and a resin (e.g., PET) film 4 which is adhered to the electromagnetic wave shield film 2 via a pressure-sensitive adhesive layer 3 to protect the shield film. A bus-bar 5 made of silver paste is provided on part of the periphery of the transparent substrate 1 for electrically connecting the electromagnetic wave shield film 2 to the outside. The thickness of the bus-bar 5 is preferably 20 μm or smaller. A colored ceramic pattern may be formed on the periphery of the transparent substrate 1 to screen the bus-bar from view. A film containing a dye for visible light color correction may be provided at any position to make the transmission of the filter approximate to a neutral color.

Figure 3:
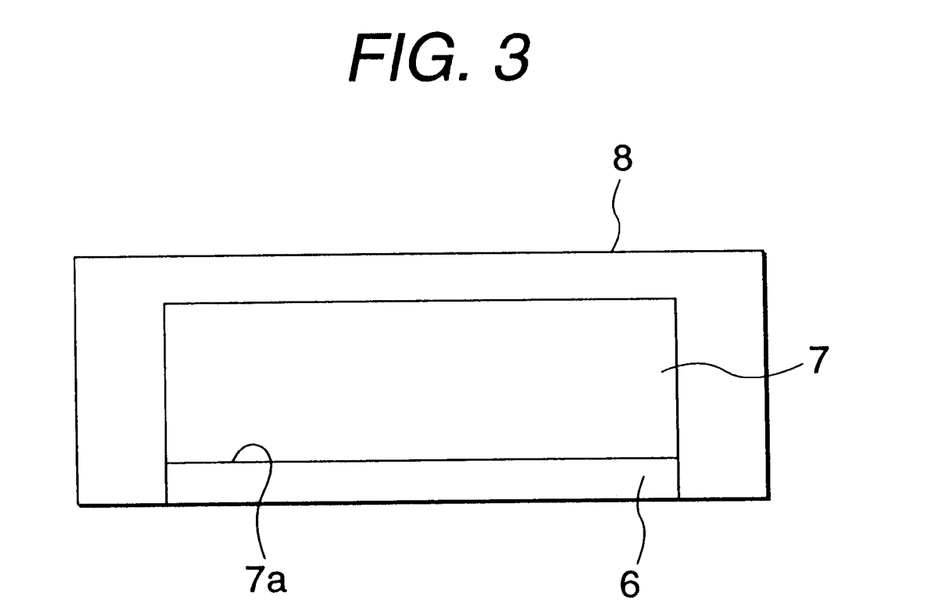
FIG. 3 schematically shows usage of the electromagnetic wave filter of the invention.

FIG. 3 illustrates an example of the manner of using the light transmitting electromagnetic wave filter 6 as a front filter of a plasma display. The filter 6 is stuck to the display surface 7a of a plasma display 7, and the filter 6 and the display 7 are put in a housing 8. An antireflection surface treatment may be applied to the surface of the light transmitting electromagnetic wave shield film, the outer or inner surface of the resin film, the side of the transparent substrate that is not coated with the electromagnetic wave shield film, and the like to increase the luminous transmittance to 65% or higher. The light transmitting electromagnetic wave filter can also be used as a front glass plate forming a discharge cell of the plasma display.

Figure 4:
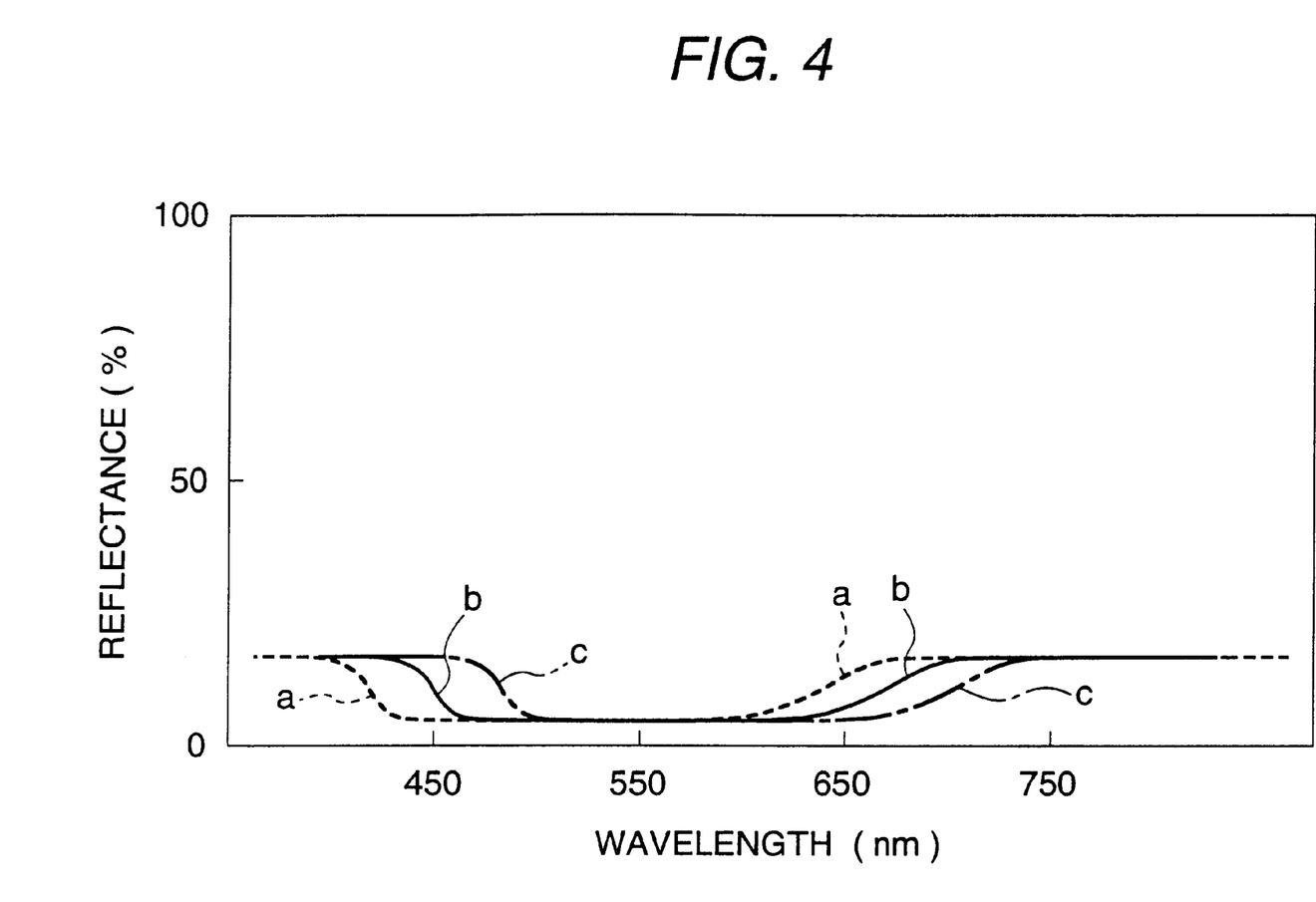
FIG. 4 is a graph showing the influence of thickness of dielectric layers on reflection characteristics in the visible region.
Figure 5:
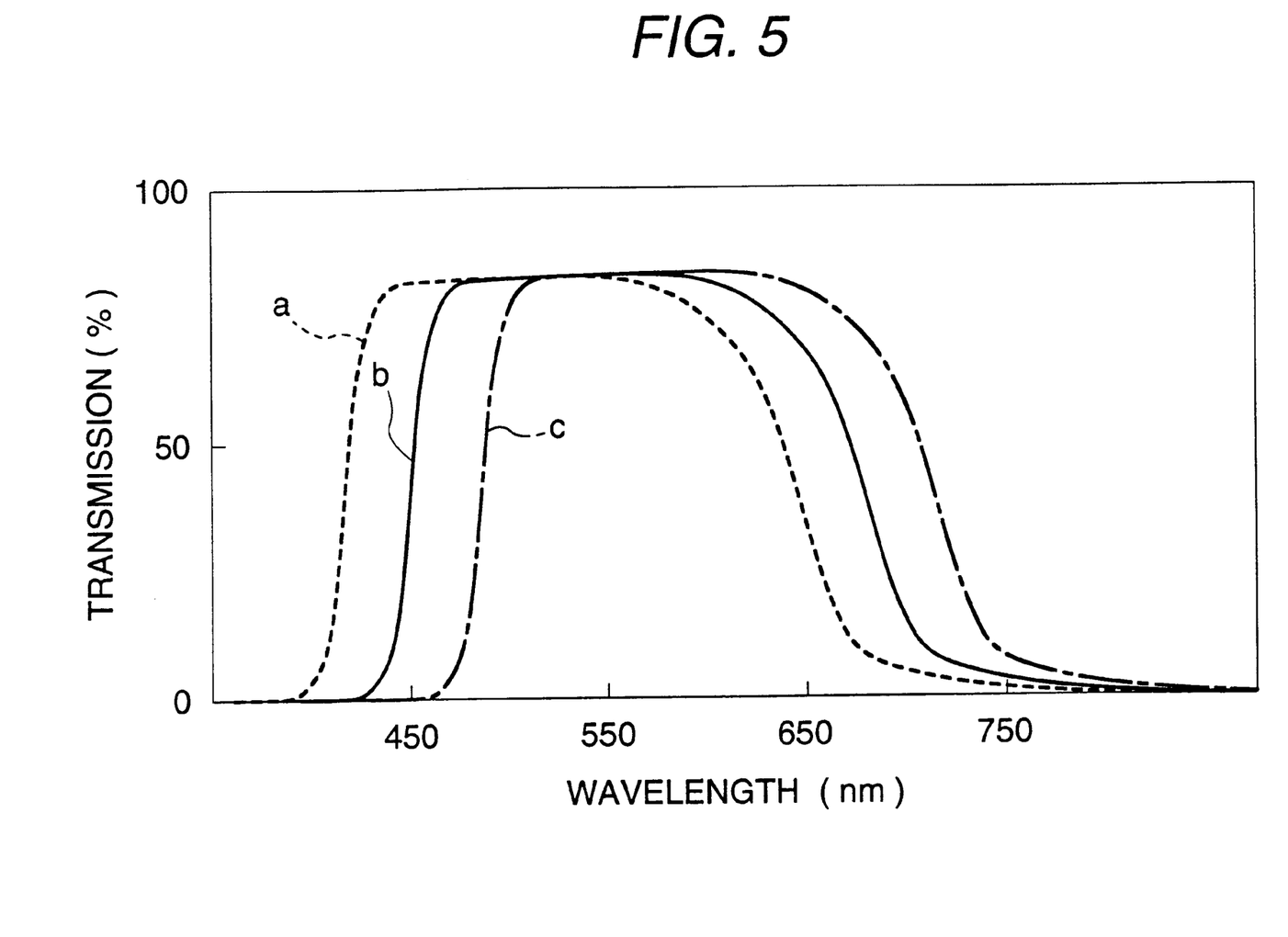
FIG. 5 is a graph depicting the influence of thickness of dielectric layers on transmission characteristics in the visible region.

FIGS. 4 and 5 are spectra showing the influence of thickness of dielectric layers on reflectance and transmission, respectively, in the visible region. In the graphs, the thickness of dielectric layers increases in alphabetical order. It is seen that the middle wavelength of the region in which the reflectance is minimal or the transmission is maximal is shifted to the longer wavelength as the thickness of the dielectric layers increases.

According to the process for producing the light transmitting electromagnetic wave filter of the invention, the metal oxide layer constituting the dielectric layer is formed by sputtering using a metal oxide sintered body having a sheet resistance of 50 Ω/□ or less. A target of a metal oxide sintered body having a sheet resistance of 50 Ω/□ or less is sputtered in a sputtering gas atmosphere containing argon or containing argon and oxygen to form an antistatic metal oxide layer on a transparent substrate.

The sputtering gas can contain, if desired, several percents by volume of oxygen in order to reduce oxygen defects in the metal oxide layer and to minimize visible light absorption by the metal oxide layer. A small amount, usually not more than 5% by volume of oxygen will suffice to form a transparent metal oxide layer. In order to avoid oxygen shortage in the metal oxide layer, it is preferred for the sputtering gas to contain 0.1% by volume or more, particularly 2% by volume or more, of oxygen, while varying depending on the kind of the metal oxide.

The silicon nitride or silicon oxynitride layer as a barrier layer can be formed by reactive sputtering using a silicon as a target and a nitrogen/argon mixed gas or a nitrogen/oxygen/argon mixed gas as a sputtering atmosphere. In this case, it is preferred for silicon to contain several parts per million of boron, aluminum or phosphorus to reduce the sheet resistance of the target to about 50 Ω/□ or less.

As stated above, sputtering for the formation of the metal oxide layer constituting a dielectric layer is performed by using the metal oxide as a target in an atmosphere containing argon, unlike reactive sputtering which is conducted by using the corresponding metal as a target in an argon atmosphere which contains a large quantity of oxygen that is usually required for forming a transparent metal oxide layer. The sputtering gas comprises an inert gas such as argon as a main component and a small amount of oxygen. The antistatic metal oxide target can be sputtered by small oxygen plasma to form an antistatic dielectric layer.

Since the dielectric layer is antistatic, development of micro arcing can be avoided in the formation of the dielectric layer and the barrier layer on the dielectric layer. As a result, development of pin holes in the light transmitting electromagnetic wave shield film can be suppressed effectively.

Since the metal oxide layer is deposited by sputtering using a metal oxide sintered body as a target, the required amount of oxygen in the sputtering gas is small. Therefore, while a metal oxide layer is being deposited on a previously formed silver layer by sputtering, deterioration of the silver layer by oxygen plasma can be suppressed. The crystallinity of the silver layer is also prevented from deterioration. Thus a so-called sacrificial layer for silver layer protection (a very thin metal (e.g., zinc) layer which is to be oxidized thereby to protect the underlying silver layer) is no more necessary, and there is obtained an excellent light transmitting electromagnetic wave shield film showing no optical absorption.

In carrying out sputtering to form the metal oxide layers as dielectric layers, direct current (DC) sputtering can be used. It is preferable that a metal oxide sintered body is set on a pair of magnetron sputtering cathodes, and a voltage is applied to each cathode while reversing the polarities of the targets at a frequency of 10 Hz to 1 MHz.

Formation of the silicon nitride or silicon oxynitride layer, which constitutes the barrier layer, by sputtering can be performed by DC sputtering using a silicon sintered body as a target. In this case, too, it is preferred to use a set of two magnetron sputtering cathodes while reversing their polarities with each other.

Since the polarity applied to each cathode is reversed in a very short time, film of silicon nitride or silicon oxynitride which is accumulated on the surface of the target and charged can be destaticized. Further, since the substrate and its surroundings do not act as an electrode, a stable glow discharge can be maintained without being influenced by the potential variations due to the oxide or nitride layer that is being deposited. The pair of targets act as a cathode and an anode alternately so that a stable glow discharge is maintained while cleaning the surface of the targets by sputtering. In case where, for example, a barrier layer of silicon nitride is formed by nitrogen-reactive sputtering using a silicon target (endowed with slight conductivity by doping with a trace amount of boron or aluminum), film of silicon nitride accumulated in the vicinity of the border between the eroded and the non-eroded portions of the target is not to be charged by the above-described destaticizing effect. As a result, no arcs develops.

In order to secure a stable discharge, the frequency of reversing the polarities is preferably in the range of 10 kHz to 100 kHz. In order to secure stability of the discharge plasma, the frequency is most preferably from 40 to 50 kHz. From the standpoint of destaticizing action, it is preferred that the applied voltage or current has such a wave form on the time axis that the cumulative charges on plus side (positive polarity) and those on minus side (negative polarity) cancel each other out when seen over a long time, e.g., a sine wave or a pulse wave. Accordingly, it is preferred to apply such a voltage as has a wave form symmetric about the time axis that can be treated by Fourier transformation.

The silver layer can be formed by DC magnetron sputtering. This layer being made of an extremely highly conductive material, there is no problem of discharge stability. The sputtering gas to be used is preferably pure argon.

The light transmitting electromagnetic wave shield film is usually formed at room temperature. The substrate can be heated to about 200° C. or lower to markedly increase the crystallinity of deposited silver. It is a preferred manipulation that film formation at room temperature be followed by heat treatment at a temperature up to about 300° C. in the atmosphere or a nitrogen atmosphere to eliminate light absorption of the dielectric layers and to improve the specific resistance of the silver layer. In particular, where the substrate is heated to 100° C. or higher during film formation or where the resulting laminate is heated to 150° C. or higher, the sheet resistance and the visible light transmission of the resulting electromagnetic wave shield film can be stabilized against heat; that is, the rate of changes in sheet resistance and visible light transmission due to heat (e.g., 200° C.×15 mins. in the atmosphere) can be confined within ±10% and within ±5%, respectively.

In a highly preferred embodiment wherein the laminate has at least one barrier layer of silicon nitride or silicon oxynitride, the silver layer(s) contain(s) the first and the second dopants to have noticeably improved heat resistance, and the transparent substrate is a glass plate, there is provided an electromagnetic wave shielding glass plate that does not undergo deterioration even when heated to 600° C. or higher for bending or tempering. The transparent substrate usually used in the invention includes a glass plate and a resin plate.

As described above, the light transmitting electromagnetic wave shield film according to the invention has a laminate structure in which a dielectric layer and a silver layer are alternately laminated with each other, and the dielectric layer is an antistatic metal oxide layer having a refractive index of 1.6 to 2.7 at a wavelength of 550 nm. The light transmitting electromagnetic wave shield film having such a laminate structure provides an electromagnetic wave filter having a high transmission in the visible region. Since the dielectric layer is suppressed from being charged while deposited by sputtering, micro arcs are prevented from developing whereby pin holes are hardly made.

Where at least the outermost dielectric layer is a laminate of the antistatic metal oxide layer and a barrier layer comprising silicon nitride, silicon oxynitride or tin oxide, prevention of pin hole development is further ensured, the moist heat resistance of the electromagnetic wave shield film is improved, and impurities are not allowed to enter to cause deterioration.

According to the process of the present invention, since the metal oxide layer constituting the dielectric layer is formed by sputtering in a low-pressure, atmosphere of argon or argon containing a small amount of oxygen by using, as a target, a metal oxide whose sheet resistance has been adjusted to 50 Ω/□ or lower, the target surface and the deposited metal oxide layer do not become electrically insulating. As a result, the charges supplied from the glow discharge plasma are not allowed to stay on the film deposited on the substrate and the surroundings of the target. Thus, micro plasma arcs due to the charges are not generated and, as a result, the resulting light transmitting electromagnetic wave shield film suffers from few pin holes attributed to arc discharges.

Further, according to the process of the invention, a transparent metal oxide layer can be obtained in an atmosphere having a reduced oxygen content so that the underlying silver layer is effectively protected from electrical and optical deterioration by oxygen plasma. This made it possible to form an electromagnetic wave shield film exhibiting excellent electrical and optical performance.

Furthermore, wherein the sputtering for forming the dielectric layers is conducted by setting the target on a pair of magnetron sputtering cathodes and alternating the polarities of the targets, development of pin holes is prevented more effectively.

The present invention will now be illustrated in greater detail with reference to Examples and Comparative Examples, but it should be understood that the invention is not construed as being limited thereto. All the percents are given by weight unless otherwise noted.

The layer structure of the electromagnetic wave filters prepared in Examples and Comparative Examples is shown in Tables 1 and 2 below. In the Tables, the constituent layers described downward are in the order from the transparent substrate, and the figures in the parentheses indicate the thickness (unit: nm for light transmitting electromagnetic wave shield films, i.e., dielectric layers and silver layers; $\mu$m for adhesive layers and resin films) of the layer. Sputtering conditions for forming the metal oxide layers and barrier layers are summarized in Tables 3 and 4 below.

In Examples, the antistatic metal oxide layer was formed by DC magnetron sputtering using a metal oxide sintered body having a controlled sheet resistance as a target in an argon atmosphere containing a trace amount of oxygen, taking into consideration optical characteristics and electrical characteristics so as to provide a transparent and antistatic dielectric layer. This sputtering mode will hereinafter be referred to as sinter DC sputtering. In Examples 2 to 5, the antistatic metal oxide layer was formed by polarity-reversed magnetron sputtering using two target electrodes (hereinafter referred to as DM sputtering). The total pressure of the sputtering atmosphere was 1 to 8 mTorr. The substrate temperature was controlled not to exceed 200° during sputtering.

In Comparative Examples, metal oxide layers were formed by oxygen-reactive DC magnetron sputtering using a metal (or a metal alloy) or a metal oxide having an uncontrolled sheet resistance as a target. This mode of sputtering will hereinafter be referred to as oxygen DC sputtering. To the sputtering atmosphere was fed oxygen in an amount sufficient for depositing a perfectly transparent metal oxide layer, taking only optical characteristics into consideration. The sputtering atmosphere had a total pressure of 1 to 8 mTorr, and the substrate temperature was controlled not to exceed 200° C. during sputtering.

Barrier layers were formed as follows. A silicon nitride layer was formed by nitrogen-reactive magnetron sputtering using a mixed gas of argon and nitrogen, and a silicon oxynitride layer was formed by nitrogen/oxygen-reactive magnetron sputtering using a mixed gas of argon, nitrogen, and oxygen. Silicon doped with a small amount of impurity to secure conductivity was used as a target. A tin oxide layer, which is electrically insulating, was formed by oxygen-reactive DC magnetron sputtering using metallic tin as a target in an atmosphere containing oxygen. In Examples 3 and 4, the barrier layer was formed by oxygen- or oxygen/nitrogen-reactive polarity-reversed magnetron sputtering using two target electrodes (hereinafter referred to as reactive DM sputtering). The sputtering atmosphere had a total pressure of 1 to 8 mTorr, and the substrate temperature was controlled not to exceed 200° C. during sputtering.

Silver layers were formed by sputtering metallic silver or Pd-, Cu- or Ti-doped silver as a target in an argon atmosphere having a total pressure of 1 to 8 mTorr-.

The abbreviations used in Tables 1 and 2 have the following meanings.

1) IZO: A deposit layer formed from a target consisting of 90% of indium oxide and to 10% of zinc oxide.
2) AZO: A deposit layer formed from a target consisting of 98% of zinc oxide and 2% of aluminum oxide.
3) TBO: A deposit layer formed from a target consisting of 98% of tin oxide and 2% of bismuth oxide.
4) ITO: A deposit layer formed from a target consisting of 95% of indium oxide and 5% of tin oxide.
5) ZrNbO: A deposit layer formed from a target consisting of 96 wt % of zirconium oxide and 4% of niobium oxide.
6) TNO: A deposit layer formed from a target consisting of 97% of titanium oxide and 3% of niobium oxide.
7) NMO: A deposit layer formed from a target consisting of 98% of niobium oxide and 2%, in term of molybdenum oxide, of molybdenum (metallic molybdenum powder was mixed with niobium oxide).
8) AgPd: A deposit layer formed from a target consisting of 99.6% of silver and 0.4% of palladium.
9) AgPdCu: A deposit layer formed from a target consisting of 98.4% of silver, 0.8% of palladium, and 0.8% of copper.
10) AgPdTi: A deposit layer formed from a target consisting of 99.0% of silver, 0.5% of palladium, and 0.5% of titanium.
11) SiN and SiNO mean silicon nitride and silicon oxynitride, respectively.

The electromagnetic wave filters prepared in Examples and Comparative Examples were evaluated as follows.

1) Moist Heat Resistance

A sample was exposed to an atmosphere of 60° C. and 90% RH. The time when development of hillocks, fogging, and the like was observed with the naked eye was taken as an indication of moist heat resistance.

2) Pin Holes

The number of pin holes per 100 cm$^2$ of a sample was counted with the naked eye and graded as follows.

A . . . 1/100 cm$^2$ or fewer

B . . . 2 to 5/100 cm$^2$

C . . . 6 to 10/100 cm$^2$

D . . . 10/100 cm$^2$ or more

3) Sheet Resistance

Measured with a four point probe resistor.

4) Transmission

Measured with a spectrophotometer. The luminous transmittance was measured by using a CIE standard illuminant D$_{65}$.

5) Optical Characteristics

A: Near IR transmission is 15% or less.

B: Near IR transmission is more than 16% to 20%.

C: Near IR transmission exceeds 20%.

6) Overall Evaluation $A(optical)+A(pinhole)=A(overall)$ $A(optical)+B(pinhole)=B(overall)$ At least one item being D=D (overall)

EXAMPLE 1

A light transmitting electromagnetic wave shield film having the layer structure shown in Table 1 ((substrate)/IZO layer/silver layer/IZO layer/silver layer/IZO layer/silver layer/IZO/SnO$_2$ layer) was formed on a 30 cm wide, 30 cm long and 2 mm thick glass substrate having a soda-limesilica composition by sputtering under the conditions shown in Table 3. A protective PET film having a pressure-sensitive adhesive layer was stuck to the electromagnetic wave shield film. The performance properties of the resulting electromagnetic wave filter are shown in Table 5 below. As shown in Table 5, the transmissions at 450 nm, 550 nm and 650 nm (corresponding to blue, green and red, respectively) were as high as 60% or more, and the near infrared transmission was as low as 13%, which is lower than the level practically demanded for shied performance (20% or lower). The sheet resistance was 1.9 Ω/□, which is lower than the required level (3 Ω/□ or lower). The moist heat resistance exceeded the required level, 10000 hours. Comprising antistatic metal oxide layers as dielectric layers, the resulting electromagnetic wave shield film was graded A as to pin hole level.

EXAMPLES 2 TO 9

Light transmitting electromagnetic wave filters were prepared and evaluated in the same manner as in Example 1, except for changing the laminate structure of the light transmitting electromagnetic shield film and/or the resin film as shown in Table 1. The conditions of film formation are shown in Table 2. The results of evaluation are shown in Table 5. It is seen that the resulting electromagnetic wave filters have a high transmission in the visible light region and a low transmission in the infrared region. The filters also had a low sheet resistance of 2 Ω/□ or lower, proving excellent in electromagnetic wave shielding performance. Further, they exhibited a low pin hole level and high resistance to moist heat, proving practically useful.

COMPARATIVE EXAMPLE 1

A light transmitting electromagnetic wave filter was prepared and evaluated in the same manner as in Example 1, except for changing the laminate structure of the light transmitting electromagnetic shield film as shown in Table 2. The conditions of film formation are shown in Table 4. The results of evaluation are shown in Table 5. Because the dielectric layers were electrically insulating, micro arcing occurred considerably during film formation to cause many pin holes in the dielectric layers, failing to obtain satisfactory appearance. In the moist heat test, deterioration proceeded rapidly from the pin holes.

COMPARATIVE EXAMPLE 2

A light transmitting electromagnetic wave filter was prepared and evaluated in the same manner as in Example 1, except for changing the laminate structure of the light transmitting electromagnetic shield film as shown in Table 2. The conditions of film formation are shown in Table 4. The results of evaluation are shown in Table 5. Because the dielectric layers were electrically insulating, many pin holes developed in the dielectric layers, failing to give a satisfactory appearance. In the moist heat test, deterioration proceeded soon from the pin holes.

COMPARATIVE EXAMPLE 3

A light transmitting electromagnetic wave filter was prepared and evaluated in the same manner as in Example 1, except for changing the laminate structure of the light transmitting electromagnetic shield film as shown in Table 2. The conditions of film formation are shown in Table 4. The results of evaluation are shown in Table 5. Because the dielectric layers were electrically insulating, micro arcing occurred considerably during film formation to cause many pin holes in the dielectric layers, failing to give a satisfactory appearance. In the moist heat test, satisfactory performance was not demonstrated similarly to Comparative Example 2.

TABLE 1

Layer Structure of Light Transmitting Electromagnetic Wave Filter

| | Example 1 | Example 2 | Example 3 | Example 4 | Example 5 | Example 6 | Example 7 | Example 8 | Example 9 |
|---|---|---|---|---|---|---|---|---|---|
| Transparent Substrate | glass plate | glass plate | glass plate | glass plate | glass plate | glass plate | glass plate | glass plate | glass plate |
| 1st Dielectric Layer | IZO (40) | SiN (20) AZO (20) | ITO (40) | TBO (40) | AZO (41) | ZrNbO (40) | SiN (20) TNO (20) | TNO (40) | NMO (38) |
| 1st Ag Layer | AgPd (11) | AgPdTi (11) | AgPd (11) | AgPdCu (11) | AgPd (11) | AgPd (11) | AgPdTi (11) | AgPd (11) | Ag (11) |
| 2nd Dielectric Layer | IZO (79) | AZO 31) SiN (20) AZO (30) | ITO (78) | TBO (40) | AZO (78) | ZrNbO (79) | TNO (30) SiN (20) TNO (30) | TNO (78) | NMO (40) |
| 2nd Ag Layer | AgPd (11) | AgPdTi (14) | AgPd (14) | AgPdCu (14) | AgPd (14) | AgPd (11) | AgPdTi (13) | AgPd (12) | Ag (13) |
| 3rd Dielectric Layer | IZO (78) | AZO (28) SiN (20) AZO (30) | ITO (60) SiNO (18) | TBO (79) | AZO (79) | ZrNbO (77) | TNO (29) SiN (20) TNO (30) | TNO (78) | NMO (79) |
| 3rd Ag Layer | AgPd (11) | AgPdTi (11) | AgPd (11) | AgPdCu (11) | AgPd (11) | AgPd (11) | AgPdTi (11) | AgPd (11) | Ag (11) |
| 4th Dielectric Layer | IZQ (20) SnO$_2$ (16) | AZO (16) SiN (20) | ITO (24) SiNO (12) | TBO (18) SiNO (18) | AZO (37) | ZrNbo (20) SiN (16) | TNO (16) SiN (20) | TNO (36) | NMO (20) SiNO (18) |
| Specific Resistance of Antistatic Metal Oxide Layer (Ωcm) | 0.0062 | 0.054 | 0.0021 | 0.012 | 0.053 | 0.07 | 0.04 | 0.04 | 0.09 |
| Pressure-Sensitive Adhesive Layer | (50) | (100) | (50) | (50) | (100) | (100) | (100) | (100) | (100) |
| Resin Film | PET (100) | TAC (75) | PET (100) | PET (100) | PET (50) | PET (50) | PET (100) | PET (75) | PET (100) |

TABLE 2

Layer Structure of Light Transmitting Electromagnetic Wave Filter

| | Comparative Example No. | | |
|---|---|---|---|
| | 1 | 2 | 3 |
| Transparent Substrate | glass plate | glass plate | glass plate |
| 1st Dielectric Layer | SiN (16) | AZO (40) | SnO$_2$ (40) |
| | ZnO (20) | | |
| 1st Ag Layer | AgPd (9) | Ag (11) | Ag (11) |
| 2nd Dielectric Layer | ZAO (31) | AZO (79) | SnO$_2$ (79) |
| | SiN (20) | | |
| | ZnO (30) | | |
| 2nd Ag Layer | AgPd (11) | Ag (14) | Ag (14) |
| 3rd Dielectric Layer | ZnO (28) | AZO (78) | SnO$_2$ (79) |
| | SiN (20) | | |
| | ZnO (30) | | |

TABLE 2-continued

Layer Structure of Light Transmitting Electromagnetic Wave Filter

| | Comparative Example No. | | |
|---|---|---|---|
| | 1 | 2 | 3 |
| 3rd Ag Layer | AgPd (9) | Ag (11) | Ag (11) |
| 4th Dielectric Layer | ZnO (16) | AZO (35) | SnO$_2$ (36) |
| | SiN (20) | | |
| Electric Property of Dielectric Layers | insulating | insulating | insulating |
| Pressure-Sensitive Adhesive Layer | (50) | (50) | (50) |
| Resin Film | PET (50) | PET (50) | PET (100) |

TABLE 3

Sputtering Conditions

| | Antistatic Metal Oxide Layer | | Barrier Layer | | |
|---|---|---|---|---|---|
| | Target | | Target | | |
| | Composition (wt %) | Sheet Resistance (Ω/□) | Composition (wt%) | Sheet Resistance (Ω/□) | Atmosphere Ar:O$_2$:N$_2$ (vol %) |
| Example 1 | In$_2$O$_3$/ZnO 90.0/10.0 | 0.024 | Sn | <0.005 | 2:98:0 |
| Example 2 | ZnO/Al$_2$O$_3$ 96.0/4.0 | 0.021 | B-doped Si | 0.68 | 60:0:40 |
| Example 3 | In$_2$O$_3$/SnO$_2$ 95.0/5.0 | 0.0020 | B-doped Si | 0.68 | 50:10:40 |
| Example 4 | SnO$_2$/Bi$_2$O$_3$ 98.0/2.0 | 0.052 | Al-doped Si | | 55:5:40 |
| Example 5 | ZnO/Al$_2$O$_3$ 98.0/2.0 | 0.021 | — | — | — |
| Example 6 | ZrO$_2$/Nb$_2$O$_5$ 98.0/2.0 | 0.11 | B-doped Si | 0.68 | 60:0:40 |
| Example 7 | TiO$_2$/Nb$_2$O$_5$ 97.0/3.0 | 0.08 | B-doped Si | 0.68 | 60:0:40 |
| Example 8 | TiO$_2$/Nb$_2$O$_5$ 97.0/3.0 | 0.08 | — | — | — |

TABLE 3-continued

Sputtering Conditions

| | Antistatic Metal Oxide Layer Target | | Barrier Layer Target | | |
|---|---|---|---|---|---|
| | Composition (wt %) | Sheet Resistance (Ω/□) | Composition (wt%) | Sheet Resistance (Ω/□) | Atmosphere Ar:O$_2$:N$_2$ (vol %) |
| Example 9 | Nb$_2$O$_5$/Mo 98.0/2.0 (as MoO$_2$) | 0.2 | Al-doped Si | 0.55 | 55:5:40 |

TABLE 4

Sputtering Conditions

| | Metal Oxide Layer Target | | | Barrier Layer Target | | |
|---|---|---|---|---|---|---|
| | Composition (wt %) | Sheet Resistance (Ω/□) | Atmosphere Ar:O$_2$ (vol %) | Composition (wt %) | Sheet Resistance (Ω/□) | Atmosphere Ar:O$_2$:N$_2$ (vol %) |
| Comparative Example 1 | Zn 100.0 | <0.005 | 3:97 | Al-doped Si | 0.55 | 50:10:40 |
| Comparative Example 2 | Zn 100.0 | <0.005 | 3:97 | — | — | — |
| Comparative Example 3 | Sn 100.0 | <0.005 | 3:96 | — | — | — |

TABLE 5

Results of Evaluation

| | | Example No. | | | | | | | | | Comparative Example No. | | |
|---|---|---|---|---|---|---|---|---|---|---|---|---|---|
| | | 1 | 2 | 3 | 4 | 5 | 6 | 7 | 8 | 9 | 1 | 2 | 3 |
| Trans- | 450 nm | 66 | 72 | 70 | 69 | 71 | 68 | 72 | 72 | 69 | 65 | 64 | 70 |
| mission (%) | 550 nm | 70 | 74 | 70 | 70 | 72 | 70 | 75 | 76 | 70 | 66 | 65 | 72 |
| | 650 nm | 62 | 69 | 65 | 65 | 68 | 66 | 70 | 71 | 67 | 64 | 63 | 68 |
| Luminous Transmittance (D$_{65}$) (%) | | 69 | 71 | 68 | 68 | 71 | 68 | 73 | 74 | 68 | 64 | 64 | 70 |
| Near IR (850 nm) Transmission (%) | | 16 | 15 | 18 | 18 | 14 | 15 | 14 | 16 | 17 | 22 | 23 | 21 |
| Evaluation on Optical Characteristics | | B | A | B | B | A | B | A | A | B | C | C | C |
| Sheet Resistance (Ω/□) | | 1.9 | 1.8 | 2.0 | 2.0 | 1.7 | 1.9 | 2.0 | 1.9 | 1.7 | 2.6 | 2.5 | 2.6 |
| Pin Hole Level | | A | A | A | A | A | A | A | A | A | D | D | D |
| Moist Heat Resistance (hr) | | 1920 | 2040 | 2040 | 3624 | 1920 | 2424 | 3624 | 2376 | 1896 | 720 | 576 | 624 |
| Overall Evaluation | | B | A | B | B | A | B | A | A | B | D | D | D |

EXAMPLE 10

The influences of the specific resistance of antistatic metal oxide layers constituting dielectric layers on pin hole development of the laminate were examined. Light transmitting electromagnetic wave filter samples having the layer structure shown in Table 6 were prepared by using various metal oxides shown in Table 7, and the surface resistivity of the resulting laminates was measured. In Table 7 are also shown the results obtained, the sputtering conditions used for forming the metal oxide layers, the frequency of micro arcing during the film formation, and the pin hole density of the resulting laminate.

TABLE 6

| Transparent Substrate | glass plate | |
|---|---|---|
| | Material | Thickness (nm) |
| 1st Dielectric Layer | see Table 7 | 40 |
| 1st Silver Layer | 0.5% Pd-containing Ag | 11 |
| 2nd Dielectric Layer | see Table 7 | 79 |
| 2nd Silver Layer | 0.5% Pd-containing Ag | 14 |
| 3rd Dielectric Layer | see Table 7 | 78 |
| 3rd Silver Layer | 0.5% Pd-containing Ag | 13 |
| 4th Dielectric Layer | see Table 7 | 36 |

TABLE 7

| Metal Oxide | Sputtering Condition | | | Evaluation | | | |
|---|---|---|---|---|---|---|---|
| | Target | Sputtering Mode | $O_2$ Content of Atmosphere (vol %) | Specific Resistance ($\Omega$cm) | Frequency of Micro Arcing (/min) | Pin Hole Density (/100 cm$^2$) | Overall Judgement |
| $SnO_2$:Bi | sintered body of $SnO_2/Bi_2O_3$ (98/2) mixture | sinter DC | | 0.5 | 23 | 2 | B |
| AZO | sintered body of $ZnO/Al_2O_3$ (95/5) mixture | sinter DC | | 0.2 | 11 | 1 | B |
| TNO | sintered body of $TiO_2/Nb_2O_5$ (97/3) mixture | sinter DC | | 0.01 | 6 | 0.1 | A |
| ZrNbO | sintered body of $ZrO_2/Nb_2O_5$ (98/2) mixture | sinter DC | | 0.01 | 0 | 0 | A |
| IZO | sintered body of $In_2O_3/ZnO$ (90/10) mixture | sinter DC | | 0.05 | 5 | 0.2 | A |
| AZO | Zn/Al (95/5) alloy | reactive DC | | insulating | 96 | 17 | D |
| ZnO | Zn | reactive DC | | insulating | >200 | 36 | D |

It is recognized from Table 7 that micro arcing which might have occurred on the target and in the vicinities of the substrate during the formation of metal oxide layers can be suppressed where sputtering is carried out by using the metal oxide of the metal oxide layer as a target and a gas having a small oxygen content as a sputtering atmosphere to form a dielectric layer having a small specific resistance. As a result, the number of pin holes which might be developed by the micro arcs is reduced. To the contrary, where a metal of the metal oxide layer is used as a target, a large quantity of oxygen must be present in the sputtering atmosphere in order to form a transparent oxide layer, and the resulting dielectric layer has a large specific resistance or become an electrically insulating metal oxide layer.

EXAMPLE 11

Samples were prepared in the same manner as in Example 10 by using AZO as the 1st to 4th dielectric layers, except that the top half of the thickness of the fourth antistatic dielectric layer was replaced with a barrier layer shown in Table 8 below. The sputtering conditions for forming the barrier layer are also shown in Table 8. With no resin film adhered, the samples were exposed to moist heat at 90° C. and 60% RH. The time when development of defects, such as aggregation of silver, was observed with the naked eye was taken as an indication of moist heat resistance. The results obtained are shown in Table 8.

TABLE 8

| Sample No. | Barrier Layer | Sputtering Conditions | | | Moist Heat Resistance* (hr) |
|---|---|---|---|---|---|
| | | Target | Mode | Reactive gas | |
| 1 | silicon nitride | Si | reactive DC | $N_2$ | 1008 |
| 2 | silicon oxynitride | Si | reactive DC | $N_2 + O_2$ | 1512 |
| 3 | silicon oxynitride | Si | reactive DM | $N_2 + O_2$ | 1680 |

TABLE 8-continued

| Sample No. | Barrier Layer | Sputtering Conditions | | | Moist Heat Resistance* (hr) |
|---|---|---|---|---|---|
| | | Target | Mode | Reactive gas | |
| 4 | tin oxide | Sn | reactive DC | $O_2$ | 504 |
| 5 | none | — | — | — | 72 |

Note: 90° C., 60% RH

It can be seen from Table 8 that the provision of a barrier layer significantly improves the resistance of the dielectric layers against moist heat as high as 90° C. It has now been verified that the barrier layer protects the silver layer against penetration of impurities in the air which are unfavorable to the silver layer, such as sulfur oxide and hydrogen sulfide, or the solvent of the pressure-sensitive adhesive layer which is used to adhere a resin film and may contain impurities, such as chlorine and sulfur.

While the invention has been described in detail and with reference to specific examples thereof, it will be apparent to one skilled in the art that various changes and modifications can be made therein without departing from the spirit and scope thereof.

What is claimed is:

1. A process for producing a light-transmitting electromagnetic wave filter comprising a transparent substrate having on one side thereof a light-transmitting electromagnetic wave shield film comprising 2n+1 (n≧1) layers in which at least two dielectric layers comprising an antistatic metal oxide layer and at least one silver layer are alternately laminated with each other with the dielectric layer being the first to be provided on the transparent substrate, wherein said silver layer is formed by sputtering using silver as a target, and said antistatic metal oxide layer is formed by sputtering using, as a target, a metal oxide whose sheet resistance is 50 Ω/or less, and further wherein (i) a barrier layer is provided as an intermediate layer of a metal oxide layer, or (ii) a barrier layer is provided as an intermediate layer of a metal oxide layer and a barrier layer is provided on an outer side of a metal oxide layer constituting an outermost dielectric layer.

2. The process for producing a light transmitting electromagnetic wave filter as claimed in claim 1, wherein the sputtering for forming the antistatic metal oxide layer is carried out in such a manner that a sintered body of a metal oxide powder is set on a pair of adjacent magnetron cathodes, and a negative voltage is applied to each cathode while alternately reversing the polarities of the targets at a frequency of 10 Hz to 1 MHz to generate glow discharge plasma thereby to sputter the target.

3. The process for producing a light-transmitting electromagnetic wave filter as claimed in claim 1, wherein the barrier layer is one of silicon nitride and silicon oxynitride.

4. The process for producing a light-transmitting electromagnetic wave filter as claimed in claim 1, wherein the outermost dielectric layer is a laminate comprising an antistatic metal oxide layer and a barrier layer.

* * * * *